United States Patent
Ishioka et al.

(10) Patent No.: US 7,138,805 B2
(45) Date of Patent: Nov. 21, 2006

(54) DEVICE AND METHOD FOR INSPECTION

(75) Inventors: Shogo Ishioka, Fukayasu-gun (JP); Shuji Yamaoka, Fukuyama (JP)

(73) Assignee: OHT, Inc., Hiroshima (JP)

( * ) Notice: Subject to any disclaimer, the term of this patent is extended or adjusted under 35 U.S.C. 154(b) by 50 days.

(21) Appl. No.: 10/069,523

(22) PCT Filed: Jun. 13, 2001

(86) PCT No.: PCT/JP01/04993

§ 371 (c)(1),
(2), (4) Date: Jun. 12, 2002

(87) PCT Pub. No.: WO01/96890

PCT Pub. Date: Dec. 20, 2001

(65) Prior Publication Data

US 2002/0163342 A1    Nov. 7, 2002

(30) Foreign Application Priority Data

Jun. 16, 2000    (JP) ............................. 2000-182117

(51) Int. Cl.
*G01R 27/26* (2006.01)
*G01R 31/08* (2006.01)

(52) U.S. Cl. .................. 324/658; 324/519; 324/661; 324/663; 324/686

(58) Field of Classification Search ............... 324/765, 324/538, 750, 76.11, 658; 716/1, 4, 5, 12, 716/13, 14, 15, 16
See application file for complete search history.

(56) References Cited

U.S. PATENT DOCUMENTS

| 5,124,660 | A | * | 6/1992 | Cilingiroglu | 324/538 |
| 5,424,633 | A | * | 6/1995 | Soiferman | 324/538 |
| 6,703,849 | B1 | * | 3/2004 | Ishioka et al. | 324/750 |

* cited by examiner

*Primary Examiner*—Vincent Q. Nguyen
*Assistant Examiner*—Timothy J. Dole
(74) *Attorney, Agent, or Firm*—Westerman, Hattori, Daniels & Adrian, LLP.

(57) ABSTRACT

The present invention provides an inspection apparatus and an inspection method, capable of, when supplying an inspection signal to a circuit wiring, eliminating any need for a pin to be brought into contact with the circuit wiring and detecting any defects including an invisible microscopic defect. An inspection apparatus A for inspecting a circuit wiring of a circuit board 100 comprises a conductive member 1 adapted to be disposed on the side of one of surfaces of the circuit board 100 and to be supplied with an inspection signal, a signal source 2 for supplying the inspection signal to the conductive member 1, a sensor unit 3 including a plurality of cells 3a to be disposed the opposed to the conductive member 1 on the side of the other surface of the circuit board 100, and a computer 5 for acquiring each signal appearing at the cells 3a in response to the inspection signal supplied to the conductive member 1.

9 Claims, 11 Drawing Sheets

DEVICE AND METHOD FOR INSPECTION

TECHNICAL FIELD

The present invention relates to inspection of a circuit wiring of a circuit board.

BACKGROUND ART

In manufacturing processes of a circuit board, after forming a circuit wiring (electrically conductive pattern) on a board, it is required to inspect the presence of defects, such as disconnection or short-circuit, in the circuit wiring.

As for such an inspection technique, a contact type inspection technique has heretofore been known in which a circuit wiring was subjected to a continuity check or the like by bringing two separate pins into contact with the opposed ends of the circuit wiring to apply an inspection signal (electric signal) from one of the two pins to the circuit wiring ant then receive the inspection signal through the other pin.

However, recent progressive densification in the conductive pattern makes it difficult to assure a sufficient space for bringing the pins into contact with the circuit wiring accurately and simultaneously. Thus, a non-contact type inspection method has been proposed in which the inspection signal was received at the receiving end without using any pin and contacting the circuit wiring.

In this non-contact type inspection technique, any potential disconnection or the like in a circuit wiring is inspected by bringing a pin into contact with one of the ends of the circuit wiring subject to inspection with placing a sensor close to the other end of the circuit wiring, and then supplying a temporally variable inspection signal to the pin to detect a signal appearing at the sensor through a capacitance interposed between the circuit wiring and the sensor.

This technique can achieve the inspection by bringing a pin into contact with only one end of the circuit wiring. Thus, in particular, this technique advantageously makes it possible to inspect a fine circuit wiring.

However, in any conventional inspection techniques, it is essential to bring at least one pin into contact with a circuit wiring to supply an inspection signal. This means that such techniques are unavailable if a circuit wiring is so fine as to preclude the pin from bringing into contact therewith. Further, extremely fine conductive objects such as fragments of a conductive pattern attached on a circuit board as dusts during manufacturing processes of the circuit board or the like cannot be practically inspected by such techniques because such objects cannot be visually distinguished.

It is therefore an object of the present invention to provide an inspection apparatus and inspection method capable of eliminating the need for any pin to be brought into contact with a circuit wiring when supplying an inspection signal to the circuit wiring and capable of detecting any invisible microscopic defects.

DISCLOSURE OF INVENTION

According to the present invention, there is provided an inspection apparatus for inspecting a circuit wiring of a circuit board, comprising a conductive member adapted to be disposed on the side of one of the surfaces of the circuit board and to be supplied with an inspection signal, means for supplying the inspection signal to the conductive member, a plurality of cells adapted to be disposed on the side of the other surface of the circuit board with opposing to the conductive member, and means for acquiring each signal appearing at the cells in response to the inspection signal applied to the conductive member.

Further, according to the present invention, there is provided an inspection method for inspecting a circuit wiring of a circuit board, comprising the steps of disposing a conductive member, which is adapted to be supplied with an inspection signal, on the side of one of the surfaces of the circuit board, disposing a plurality of cells on the side of the other surface of the circuit board with opposing to the conductive member, supplying the inspection signal to the conductive member, and acquiring each signal appearing at the cells in response to the inspection signal applied to the conductive member.

Further, according to the present invention, there is provided an inspection apparatus for inspecting a circuit wiring of a multilayer circuit board having an overall electrode layer, comprising means for supplying an inspection signal to an overall electrode of the overall electrode layer, a plurality of cells adapted to be disposed on the side of at least either one of the surfaces of the circuit board with opposing the overall electrode, and means for acquiring each signal appearing at the cells in response to the inspection signal applied to the overall electrode.

Further, according to the present invention, there is provided an inspection method for inspecting a circuit wiring of a multilayer circuit board having an overall electrode, comprising the steps of placing a plurality of cells on the side at least either one of the surfaces of the circuit board with opposing an overall electrode of the overall electrode layer, supplying an inspection signal to the overall electrode, and acquiring each signal appearing at the cells in response to the inspection signal applied to the overall electrode.

Further, according to the present invention, there is provided an inspection apparatus for inspecting a circuit wiring of a circuit board, comprising a plurality of first cells adapted to be disposed on the side of one of the surfaces of the circuit board, a plurality of second cells adapted to be disposed on the side of the other surface of the circuit board, means for supplying the inspection signal to either one of the first cells and the second cells, and means for acquiring each signal appearing at the other one of the first cells and the second cells in response to the inspection signal applied to the one of the first cells and the second cells.

Further, according to the present invention, there is provided an inspection method for inspecting a circuit wiring of a circuit board, comprising the steps of disposing a plurality of first cells on the side of one of the surfaces of the circuit board, disposing a plurality of second cells on the side of the other surface of the circuit board, supplying an inspection signal to either one of the first cells and the second cells, and acquiring each signal appearing at the other one of the first cells and the second cells in response to the inspection signal applied to the one of the first cells and the second cells.

Further, according to the present invention, there is provided an inspection method for inspecting a circuit wiring of a circuit board, comprising the steps of disposing a plurality of first cells on the side of one of the surfaces of the circuit board, disposing a plurality of second cells on the side of the other surface of the circuit board, supplying an inspection signal to the first cells, acquiring each signal appearing at the second cells in response to the inspection signal applied to the first cells, supplying an inspection signal to the second cells, and acquiring each signal appearing at the first cells in response to the inspection signal applied to the second cells.

Further, according to the present invention, there is provided an inspection apparatus for inspecting a circuit wiring of a circuit board, comprising a conductive member adapted to be disposed on the side of one of the surfaces of the circuit board and to be supplied with an inspection signal, means for supplying the inspection signal to the conductive member, a plurality of cells adapted to be disposed on the side of the other surface of the circuit board with opposing the conductive member, and processing means for acquiring and processing each signal appearing at the cells in response to the inspection signal applied to the conductive member.

In the present invention, the above processing means may include a signal processing circuit, such as an amplifier, A/D converter, waveform-shaping circuit or any combination thereof, or a measuring instrument or computer.

BEST MODE FOR CARRYING OUT THE INVENTION

Figure 1:
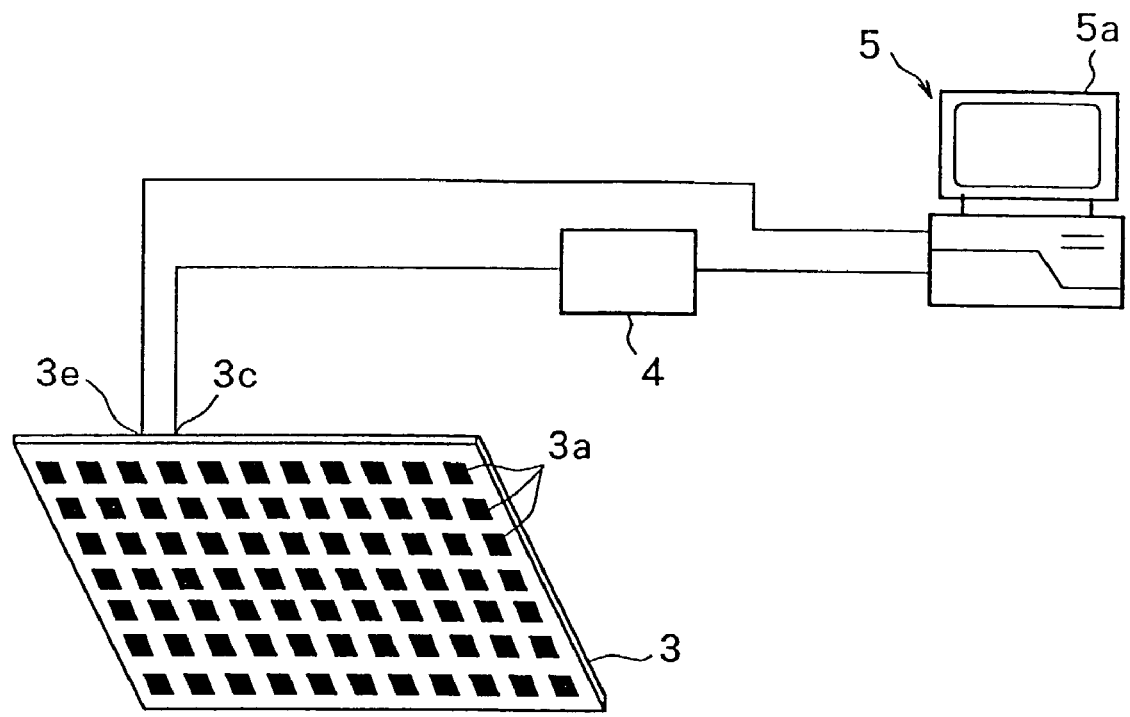
FIG. 1 is a block diagram showing an inspection apparatus A according to one embodiment of the present invention.
Figure 1:
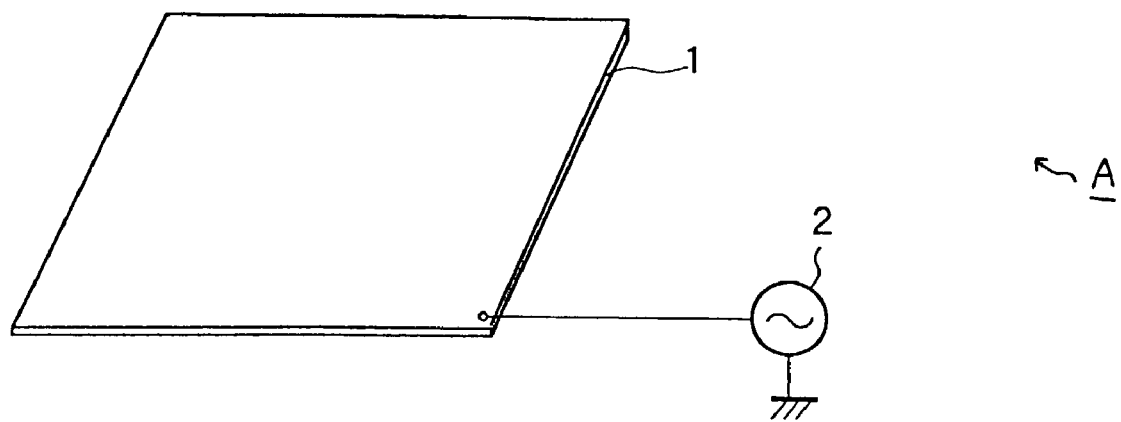
Figure 2:
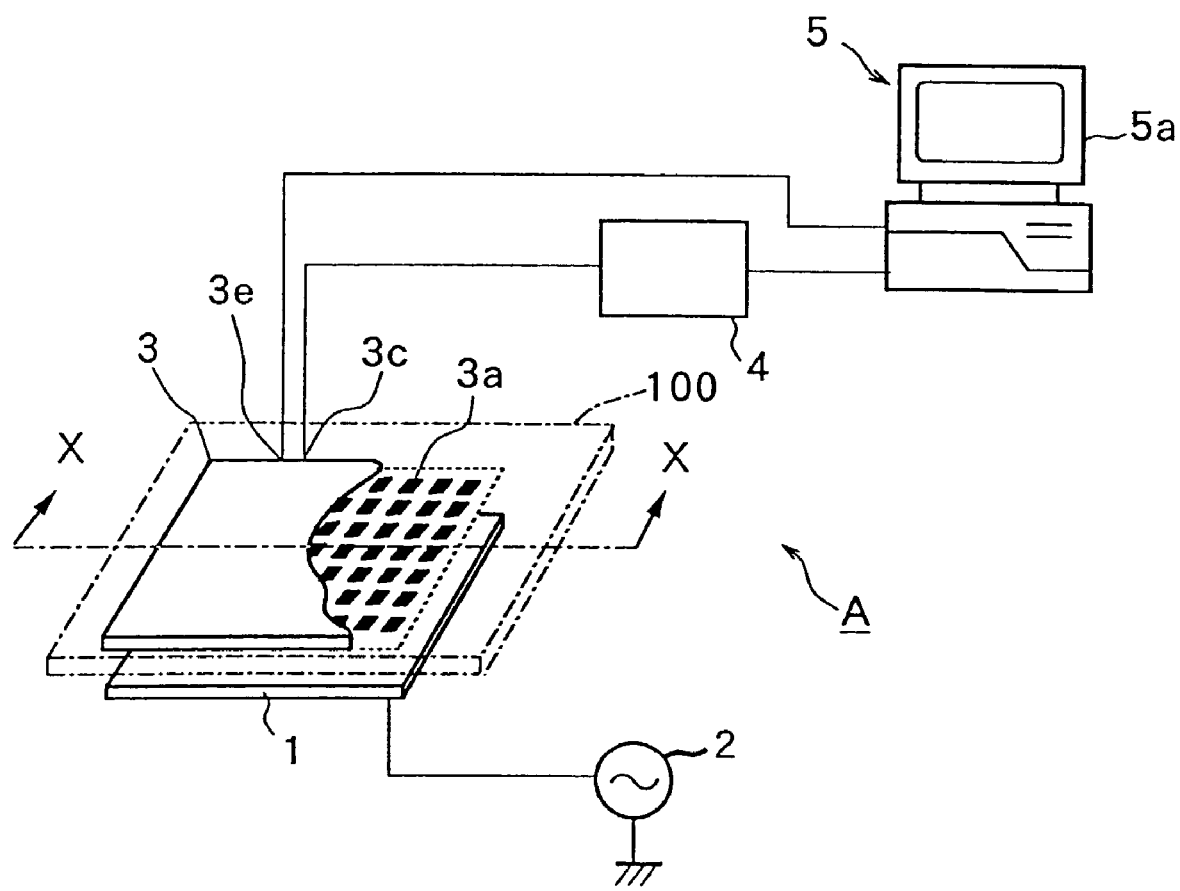
FIG. 2 illustrates the state when a circuit board 100 is inspected by the inspection apparatus A.

FIG. 1 is a schematic block diagram showing an inspection apparatus A according to one embodiment of the present invention. FIG. 2 illustrates the state when a circuit board 100 is inspected by the inspection apparatus A (which is partially cut-away and drawn in perspective).

<Construction of Inspection Apparatus A>

The inspection apparatus A comprises a conductive member 1 adapted to be supplied with an inspection signal, a signal source 2 for supplying the inspection signal to the conductive member 1, a sensor unit 3 having a plurality of cells 3a, a signal-processing unit 4 for processing signals (hereafter referred to as "output signal") appearing at the cells 3a, and a computer 5 for controlling the sensor unit 3 and acquiring the processed output signal from the signal-processing unit 4.

As shown in FIG. 2, the conductive member 1 is disposed on the side of one of the surfaces (the bottom surface in FIG. 2) of the circuit board 100 during inspection. In this embodiment, the conductive member 1 is formed entirely in a flat plate shape to extend along or in conformity with the surface (the bottom surface) of the circuit board 100.

Instead of forming entirely in the flat plate shape, the conductive member 1 may be formed to have a partial surface in conformity with the surface of the circuit board 100 to meet the need. Further, the circuit board 100 can partially have a non-flat plate shape or a curved surface. In this case, the conductive member 1 is desirably formed in a shape having a partial surface (curved surface) in conformity with the curved surface of the circuit board. When inspecting with a higher degree of accuracy, it is desirable to have a shape providing approximately the same distance between the surface of the conductive member 1 and each of circuit wirings of the circuit board 100.

Figure 3:
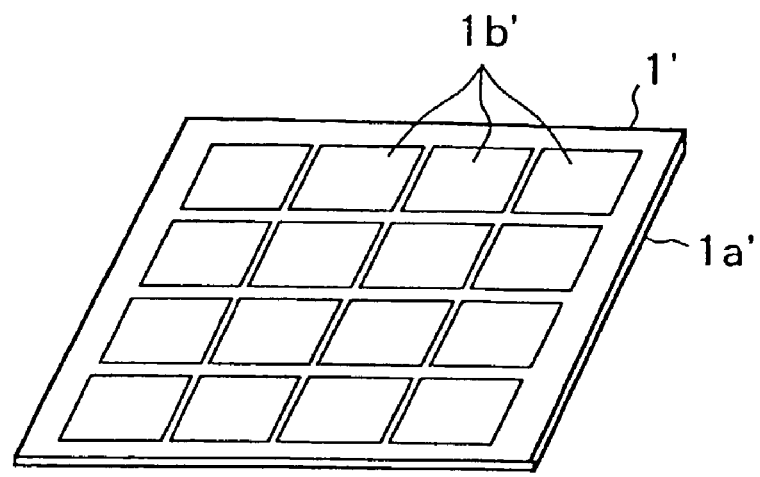
FIG. 3 is a schematic diagram of a conductive member 1'.

In this embodiment, the conductive member 1 is a single conductive body made of a conductive metal (such as copper). However, the conductive member 1 is not limited to be a single conductive body, and may be composed of a plurality of conductive pieces. FIG. 3 shows such an example. A conductive member 1' is composed of a plurality of conductive pieces 1b' arranged close to each other and on an insulating plate 1a'.

The signal source 2 generates a temporally variable inspection signal, such as an AC signal or pulse signal. In this embodiment, the signal source 2 continuously generates an electric signal having a periodically variable voltage. For example, the period of voltage variation of the inspection signal is desirably set in the range of 500 kHz to 10 MHz. While the signal source 2 has been independently provided in this embodiment, such a signal may be generated by the computer 5.

Figure 4:
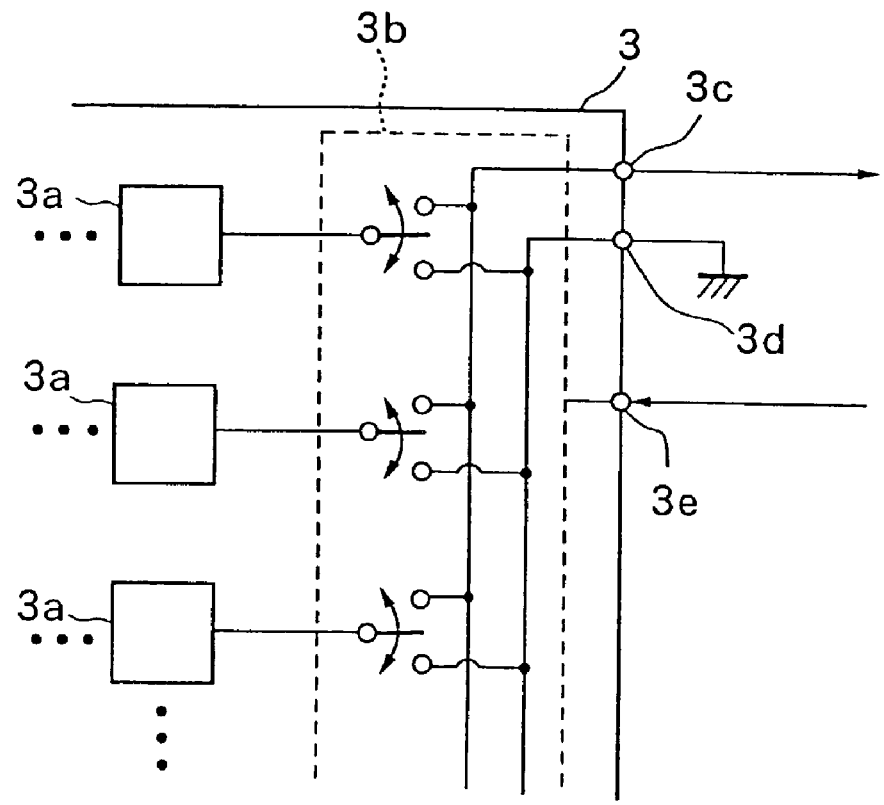
FIG. 4 is a block diagram of a sensor unit 3.

With reference to FIG. 4, the construction of the sensor unit 3 will be described below. FIG. 4 is a block diagram of the sensor unit 3.

The sensor unit 3 includes a plurality of cells 3a provided on the surface thereof, a switching circuit 3b, and terminals 3c to 3e. As shown in FIG. 2, during inspection, the sensor unit 3 is disposed on the side of the other surface (the top surface in FIG. 2) of the circuit board 100 with opposing the surface having cells 3a to the circuit board 100. Thus, the cells 3a are disposed opposed to the conductive member 1, and the circuit board 100 is sandwiched between the conductive member 1 and the sensor unit 3. The cells 3a are two-dimensionally arranged on the surface of the sensor unit 3. Thus, the cells 3a are two dimensionally disposed along or in conformity with the top surface of the circuit board 100. If the circuit board 100 has a curved surface, the cells 3a may be three-dimensionally arranged.

A cell forming a so-called non-contact type sensor of a conventional inspection apparatus for circuit boards may be applied to the cells 3a. While the cells 3a may be formed of a conductive material, such as a metal including aluminum and copper, or a semiconductor element, this embodiment will be described on the presupposition that the cells are composed of conductive metal pieces.

When inspecting with a higher degree of accuracy, each shape of the cells 3a is desirably uniformed as shown in FIG. 1 and FIG. 2. This is done to acquire an output signal without any deviation thereof.

As shown in FIG. 1 and FIG. 2, when inspecting with a higher degree of accuracy, the cells 3a are desirably arranged in a matrix form with an even distance therebetween. This arrangement provides reduced unevenness in the number per unit area of cells 3a opposed to the circuit wiring. In addition, this provides clarified relative physical relationship between each of the cells 3a and the corresponding circuit wiring, and thereby can facilitate to determine the circuit wiring corresponding to each of cells 3a.

Each size and interval of the cells 3a and the number of the cells 3a are different depending on required inspection accuracy or the specification of a circuit wiring to be inspected. However, when inspecting with a higher degree of accuracy, each size or interval of the cells 3a is desirable to be smaller than each line width of the circuit wirings or each distance between the adjacent circuit wirings. Further, each size or interval of the cells 3a is desirably set to allow two of the cells to be approximately encompassed within each line width of the circuit wirings or each distance between the adjacent circuit wirings (in view of this point, the number of the cells 3a in FIGS. 1 and 2 is selected only for the purpose of helping easy understanding). By way of example, the cells ranging from 200,000 to 2,000,000 are provided within a square ranging from 5 to 50 μm on a side.

The terminal 3c is provided to output to the signal-processing unit 4 each output signal appearing at the cells 3a which is caused by supplying an inspection signal to the conductive member 1. The terminal 3e is provided to input a control signal from the computer 5 to the switching circuit 3b. The terminal 3d is provided to connect the cells 3a to GND.

The switching circuit 3b is provided to switchingly connect either one of the cells 3a to the terminal 3c and to switchingly connect another one of cells 3a to the terminal 3d sequentially, according to the control signal from the computer 5. For example, the switching circuit may be composed of a multiplexer, demultiplexer and others. While the number of the cells 3a connected to the terminal 3c is limited to one in this embodiment because only one terminal 3c is provided, the terminal 3c may be provided to each of the cells 3a so as to acquire each output signal from two or more of the cells 3a simultaneously.

When receiving an output signal from either one of the cells 3a, it is desired to provide an enhanced S/N ratio of the output signal. This is the reason why each of the cells 3a is adapted to be connected to GND through the terminal 3d. However, when a sufficient S/N ratio can be obtained without connecting to GND, the cells 3a other than the cell 3a connected to the terminal 3c may be simply switchingly opened.

The signal-processing unit 4 is provided to perform a signal processing for allowing each output signal from the cells 3a to be readily handled by the computer 4. For example, the signal-processing unit 4 is composed of an amplifier for amplifying an output signal, a filtering circuit for shaping a waveform, an A/D converter for converting an output signal from an analog signal to a digital signal and others. The signal-processing unit 4 may be selectively constructed as an independent unit or an extended interface of the computer 5.

The computer 5 is provided to send a control signal to the sensor unit 3 and determine one of the cells 3a to be connected to the terminal 3c. Further, the computer 5 performs an inspection operation of the circuit wiring on the circuit board 100 and other operations according to each output signal from the cells 3a and others. A general-purpose computer may be used as the computer 5. Further, in this embodiment, the computer 5 functions to display an image of a circuit wiring as a subject of inspection on a display 5a according to each output signal from the cells 3a and others, and includes a memory which stores therein wiring data representing the position and shape of a circuit wiring as a subject of inspection, as described below.

<Principle of Inspection>

Figure 5:
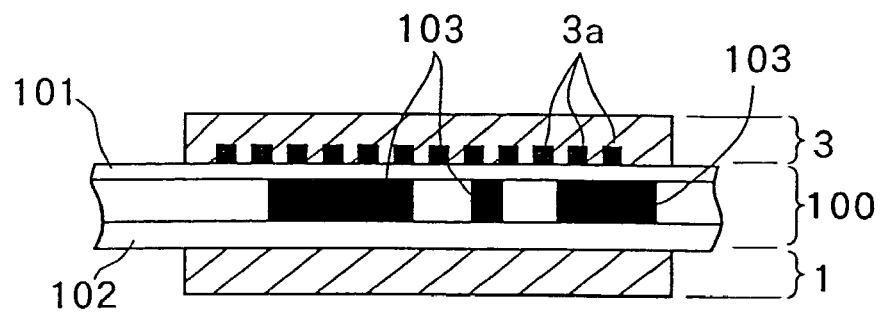
FIG. 5 is a sectional view taken along the line X—X of FIG. 2.

As shown in FIG. 2, in the inspection apparatus A, the circuit board 100 as a subject of inspection is disposed with being sandwiched between the conductive member 1 and the sensor unit 3. FIG. 5 is a sectional view taken along the line X—X of FIG. 2.

In FIG. 5, the sensor unit 3 and the conductive member 1 are brought into close contact with the top surface and the bottom surface of the circuit board 100, respectively. While it is not essential to bring them into close contact with each other, it is desirable to allow each of the cells 3a and the circuit wiring or the surface of the conductive member 1 and the circuit wiring to be disposed in parallel with each other.

In FIG. 5, the circuit board 100 includes a base layer 102, a protective film layer 101, and circuit wirings 103 (indicated by black-colored areas) provided between the base layer 102 and the protective film layer 101.

In this state, the circuit board 100 electrically acts as a capacitor sandwiched between two conductors (the conductive member 1 and the cell 3a). Thus, when an inspection signal is supplied from the signal source 2 to the conductive member 1, a signal (output signal) in response to the inspection signal will appears at each of the cells 3a.

Figure 6:
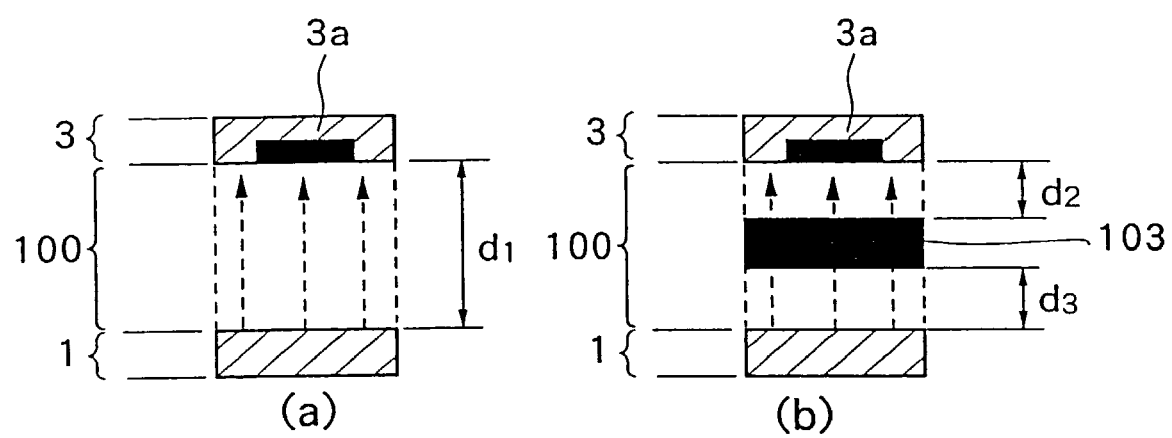
FIG. 6 is an explanatory diagram of the difference of capacitance in the circuit board 100 depending on the presence or absence of a circuit wiring.

At this moment, the circuit board portion with the circuit wiring 103 and another portion without any circuit wiring have different capacitances. FIG. 6 is an explanatory diagram of the difference of capacitance in the circuit board 100 depending on the presence of the circuit wiring. FIG. 6(a) illustrates the case in which no circuit wiring exists between the cell 3a and the conductive member 1, and FIG. 6(b) illustrates the case in which the circuit wiring exists between the cell 3a and the conductive member 1.

In this figure, the capacitance is determined by the following formula; dielectric constant×area÷distance between electrodes (the thickness of a dielectric body). That is, the capacitance is inversely proportional to the distance between electrodes (the distance between the cell 3a and the conductive member 1). In FIG. 6(b), no capacitance exists in the circuit wiring 103 which is a conductor. Thus, the capacitance of the circuit board 110 has a combined capacitance derived from adding the capacitance in the thickness d2 (of the protective film layer 101) and the capacitance in the thickness d3 (of the base layer 102). On the other hand, in FIG. 6(a), no circuit wiring 103 exists. Thus, the capacitance is determined by the thickness d1 of the circuit board 110.

As above, each portion of the circuit board 101 has a different capacitance depending on the presence of the circuit wiring 103. As a result, the cell 3a disposed at a position where the circuit wiring 103 exists between the cell 3a and the conductive member 1 and another cell 3a disposed at a position where no circuit wiring exists between another cell 3a and the conductive member 1 have different intensities of their output signals appearing in response to an inspection signal supplied to the conductive member 1.

Thus, by measuring each output signal from the cells 3a, the position, shape and others of the circuit wiring 103 can be detected, and thereby any disconnection, short-circuit and chipping in the circuit wiring or any dust on the circuit board can be detected.

<Steps of Inspection>

Steps of inspection according to the inspection apparatus A will be described below.

First, with opposing to the conductive member 1, the conductive member 1 is disposed on the side of one of the surfaces of the circuit board 100, and the sensor unit 3 is disposed on the side of the other surface of the circuit board 100, to arrange them in the state as shown in FIG. 2. In this step, it is desirable to position each of the cells 3a of the sensor unit 3 correspondingly to a specific one of the circuit wirings of the circuit board 100. For example, this positioning may be achieved by putting a mark on the circuit board 100 in advance or using each distinctive shape the circuit wirings as a mark.

Then, an inspection signal is supplied from the signal source 2 to the conductive member 1. Further, a control signal is transmitted from the computer 5 to the sensor unit 3 so as to sequentially switch the cell 3a to be connected to the terminal 3e of the sensor unit 3. Each output signal appearing at the cells 3a is also acquired by the computer 5 through the signal-processing unit 4 sequentially.

Then, the acquired output signals will be evaluated to determine the presence of a defect in the circuit wirings, such as a disconnection, short-circuit or the like.

<Evaluation Method 1>

Each of the acquired output signals of the cells 3a is displayed on the display 5a of the computer 5 sequentially. Each of the intensities of the output signals is compared with the wiring diagram of the circuit wiring as a subject of inspection prepared in advance. When the output signal from the cell 3a to be positioned on the circuit wiring does not have a given intensity (the intensity is the same as that exhibited when no circuit wiring exists), or the output signal from the cell 3a to be not positioned on any circuit wiring does not have a given intensity (the intensity is the same as that exhibited when the circuit wiring exists), it can be determined that there is a defect, such as a disconnection, short-circuit or chipping in the circuit wiring, or a dust on the circuit board.

In this case, digitalizing the output signals by a given threshold allows the output signals to be readily observed. Such a threshold may be set by a preliminary experiment or the average value of the output signals.

In this evaluation method 1, it is understood that any suitable measuring instrument having a function of sampling and storing the output signals may be used for the functional section of this evaluation in the inspection apparatus A as a substitute for the computer 5.

<Evaluation Method 2>

Image data representing the position and shape of the inspected circuit wiring may be generated according to the acquired each output signal from the cells 3a, and the image may be displayed on the display 5a of the computer 5 to perform an evaluation. In this case, each acquired output signal from the cells 3a may be used as the image data for a single pixel, or the average value of the output signals from a given number of the cells 3a may be used as the image data for a single pixel.

Figure 7:
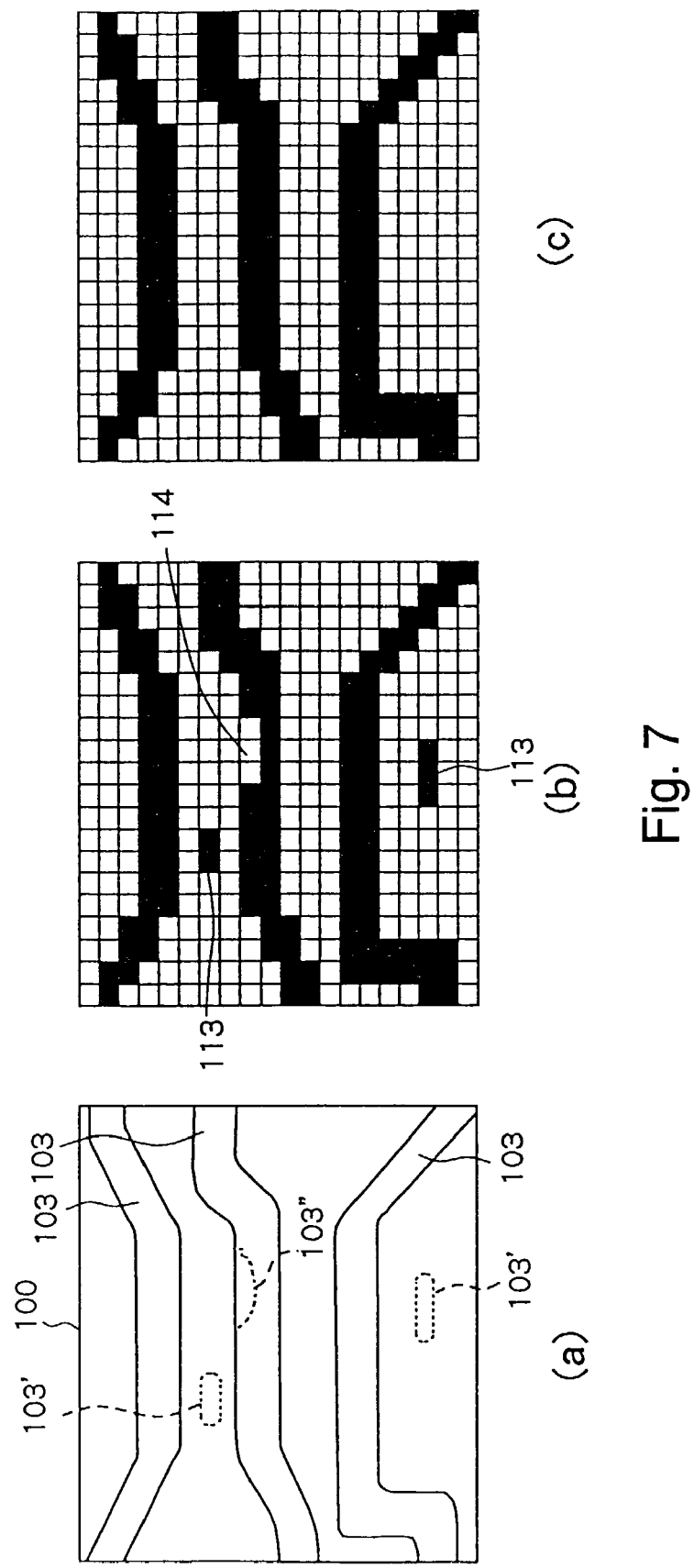
FIG. 7(a) illustrates a part of the circuit board 100 as a subject of inspection, FIG. 7(b) illustrating an image obtained from the inspection of the circuit board 100 in FIG. 7(a), and FIG. 7(c) illustrating wiring data stored in a computer 5.

When generating an image data, it is desirable to digitalize the output signals by a given threshold. This threshold can be set by the same method as that in the above evaluation method 1. A display example of an image according to the generated image data will be described with reference to FIG. 7.

FIG. 7(a) illustrates a part of the circuit wiring of the circuit board 100 as a subject of inspection, wherein each of the circuit wirings 103 indicated by solid lines is a normal wiring. The region 103' shown by a broken line shows a dust on the circuit board 100, and the region 103" shows a chipping in the circuit wiring 103. Given these defects are included.

FIG. 7(b) is a display example in which an image obtained by inspecting the circuit board 100 of FIG. 7(a) is displayed on the display 5a. In FIG. 7(b), each box (pixel) corresponds to each of the cells 3a or a given number of the cells 3a. The region in which the circuit wiring is detected is blacked out, and the region in which no circuit wiring is detected is left in while. As shown in FIG. 7(b), the square 113 and the squares 114 are indicated by black and white correspondingly to the dust 103' and chip 103" shown in FIG. 7(a), respectively. Thus, an inspector can determine the presence of the dust 103' and chip 103" on the circuit board 110 by comparing the image of FIG. 7(b) with the wiring diagram of the circuit wiring as a subject of inspection prepared in advance. If the dust 103' is microscopic and invisible, it is extremely difficult to find such a dust according to the conventional inspection method because of the difficulty in supplying an inspection signal by a pin. However, it is to be understood that this inspection apparatus A allows such a dust to be readily detect. Similarly, it is understood that a disconnection and/or short-circuit of the circuit wiring can be detected.

As described above, the computer 5 can store in the memory the wiring data representing the position and shape of the circuit wiring as a subject of inspection. Thus, a defect on the circuit wiring can also be detected automatically by the computer 5 through the use of this wiring data.

FIG. 7(c) is an exemplary diagram of wiring data to be stored in the computer 5, and this figure corresponds to the circuit wiring 103 of the circuit board 100 shown in FIG. 7(a). The wiring data may be generated according to CAD data generated in the course of designing the circuit board or the like.

Then, the computer 5 detects a common point and different point between data of the image as shown in FIG. 7(b) and the wiring data, and determines and informs the presence of a disconnection, short-circuit or chipping in the circuit wiring or a dust on the circuit board as described above.

<Application to Multilayer Circuit Board>

Figure 8:
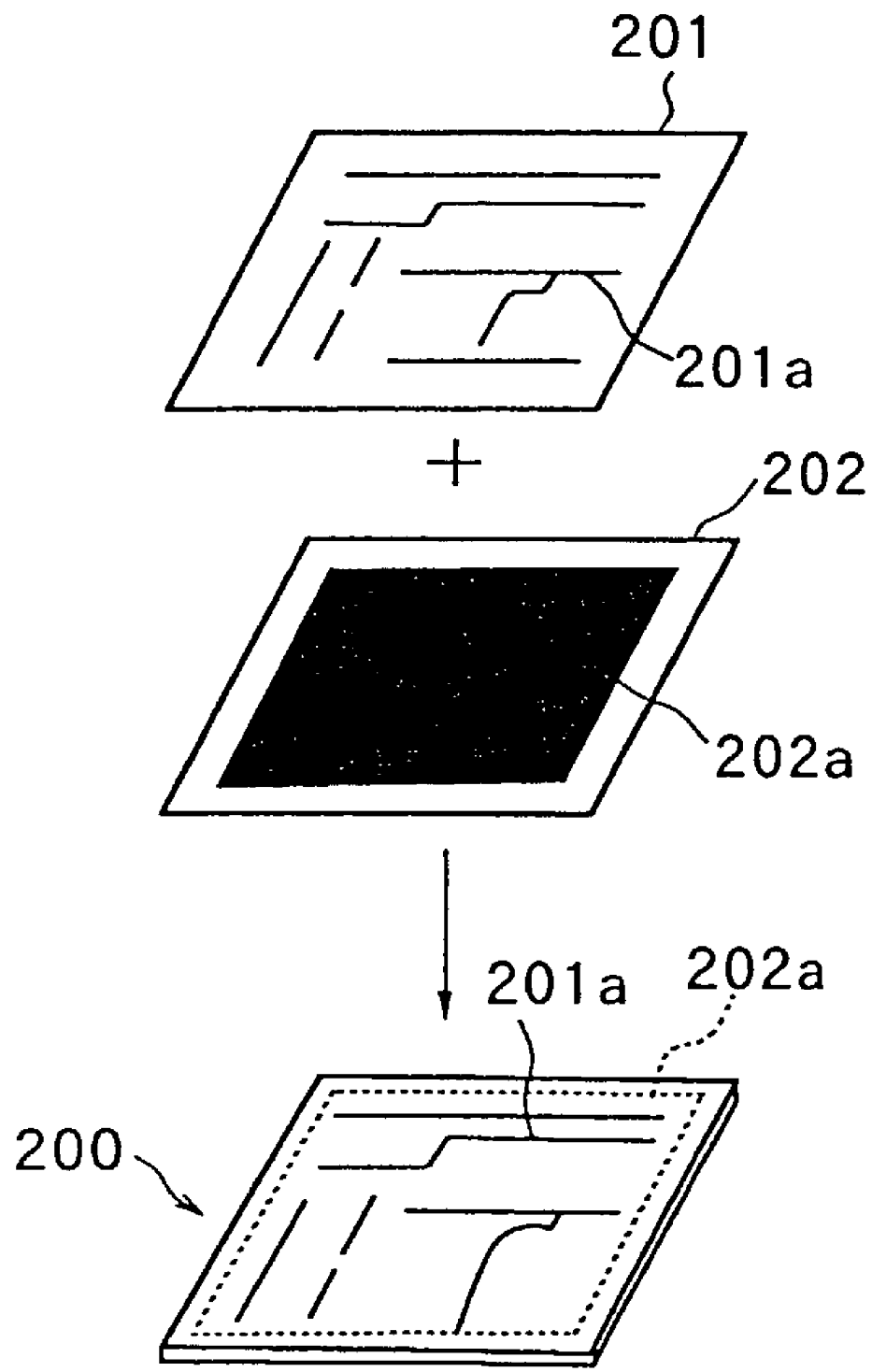
FIG. 8 is an exemplary diagram showing a multilayer circuit board having an overall electrode.

It is understood that the inspection apparatus A can inspect a multilayer circuit board. When inspecting the multilayer circuit board having an overall electrode, the overall electrode may be used as a substitute for the conductive member 1 to carry out the inspection. FIG. 8 is an exemplary diagram of a multilayer circuit board having the overall electrode.

A multilayer circuit board 200 is constructed by laminating a circuit wiring layer 201 provided with a circuit wiring 201a and an overall electrode layer 202 provided with an overall electrode 202a. Generally, the overall electrode 202a is used as a power supply pattern or a GND pattern in the circuit wiring, and is provided uniformly over a wide range of the circuit board.

The power supply pattern and GND pattern are necessary at many positions in the circuit board. Thus, such a dedicated layer is provided to concentrate such functions therein in order to simplify the layout of the circuit wirings. Further, the layers are electrically connected with each other by so-called through holes or other suitable technique.

In this case, the overall electrode 202a is obviously composed of a conductor, and extends over a wide range of the circuit wiring 201a of the circuit wiring layer 201. Thus, the overall electrode 202a may be used as a substitute for the conductive member 1 of the inspection apparatus A to inspect the circuit wiring 201*a*.

Figure 9:
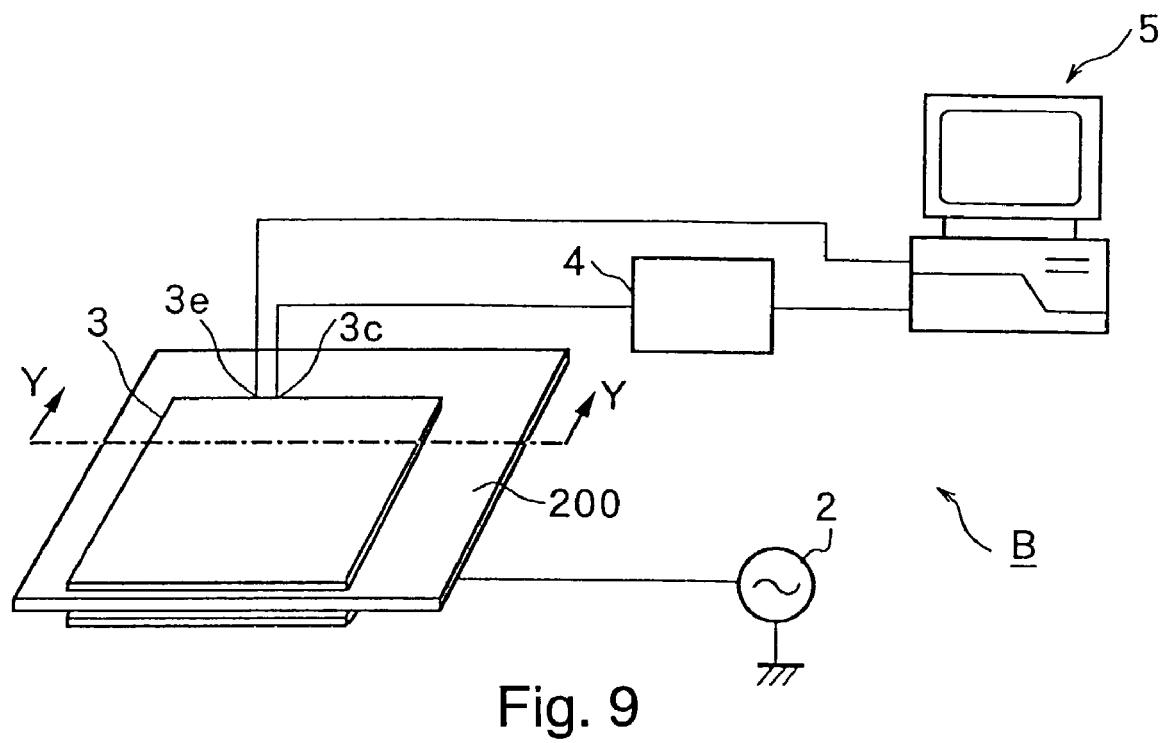
FIG. 9 is a schematic diagram of an inspection apparatus B for inspecting a multilayer circuit board having an overall electrode.
Figure 10:
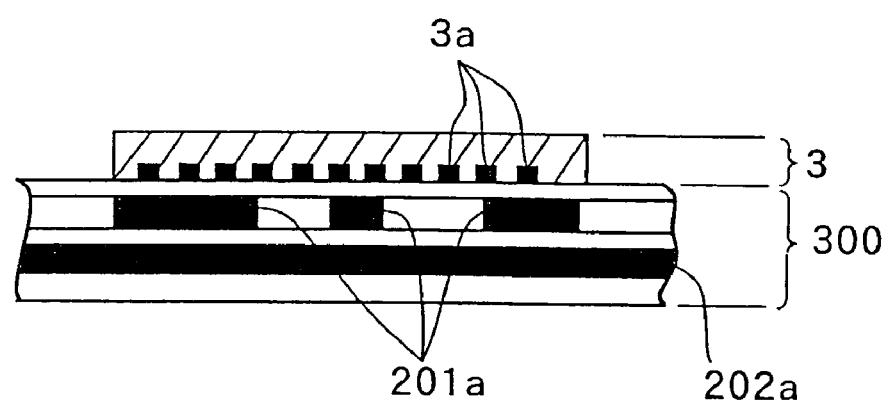
FIG. 10 is a sectional view taken along the line Y—Y of FIG. 9.
Figure 11:
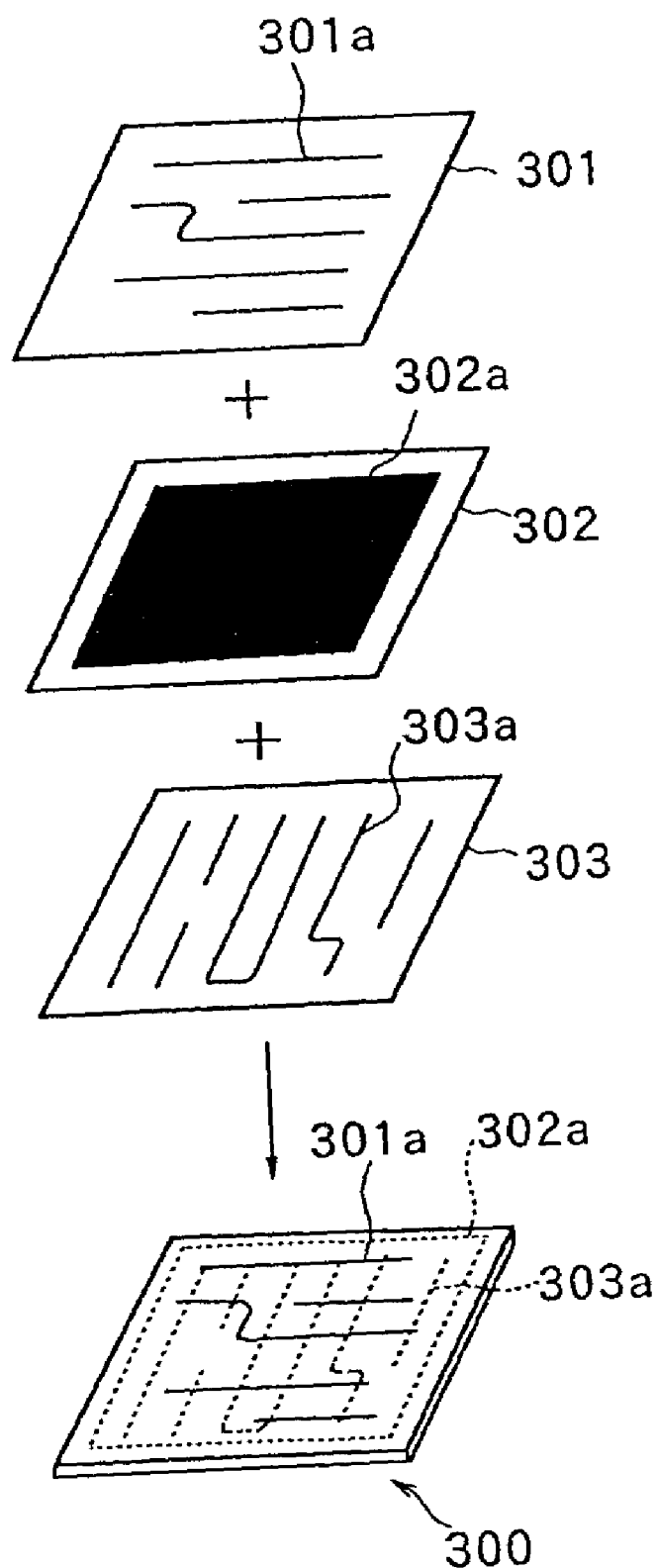
FIG. 11 illustrates another example of a multilayer circuit board having an overall electrode.

FIG. 9 is a schematic diagram of an inspection apparatus B for inspecting a multilayer circuit board having such an overall electrode. FIG. 10 is a sectional view taken along the line Y—Y of FIG. 9.

The inspection apparatus B has the same construction as that of the aforementioned inspection apparatus A except for being devoid of the conductive member 1. As shown in FIG. 9, the signal source 2 is connected directly to the overall electrode 202*a* of the multilayer circuit board 200, and an inspection signal is supplied to the overall electrode 202*a*.

In an inspection operation according to the inspection apparatus B having the above construction, the sensor unit 3 is first disposed on the side of one of the surfaces of the multilayer circuit board 200 with opposing to the overall electrode 202*a*. In this case, the sensor unit 3 is disposed to interpose the circuit wiring 201*a* to be inspected between the overall electrode 202*a* and the sensor unit 3.

Then, an inspection signal is supplied from the signal source 2 the overall electrode 202*a*. As in the inspection apparatus A, a control signal is then transmitted from the computer 5 to the sensor unit 3 so as to sequentially switch the cell 3*a* to be connected to the terminal 3*e* of the sensor unit 3. Further, each output signal appearing at the cells 3*a* is acquired by the computer 5 through the signal-processing unit 4 sequentially.

In this manner, the multilayer circuit board having the overall electrode can be advantageously inspected without the conductive member 1.

Figure 12:
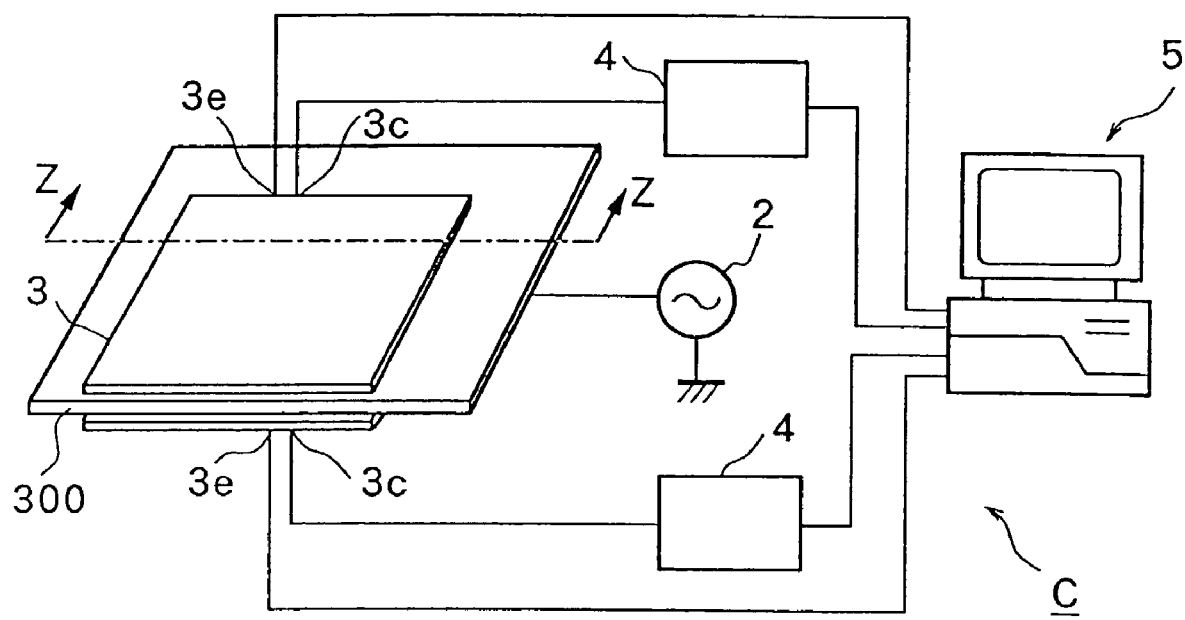
FIG. 12 is a schematic diagram of an inspection apparatus C for inspecting a multilayer circuit board 300.

The above multilayer circuit board 200 is provided with a single circuit wiring layer 201 and a single overall electrode layer 202. However, two circuit wiring layers 201 may be provided with sandwiching the overall electrode layer 202 thereby. FIG. 12 is an exemplary diagram of such a multilayer circuit board.

A multilayer circuit board 300 is constructed by laminating a circuit wiring layer 301 provided with the circuit wiring 201*a*, an overall electrode layer 302 provided with an overall electrode 302*a*, and a circuit wiring layer 303 provided with a circuit wiring 303*a*.

When the multilayer circuit board 300 is inspected by the inspection apparatus B, the sensor unit 3 is disposed on the side of one of the surfaces of the multilayer circuit board 300 to inspect in this state, and then is relocated on the side of the other surface to inspect again. Alternatively, a pair of the sensor units 3 may be used to inspect without any relocation.

Figure 13:
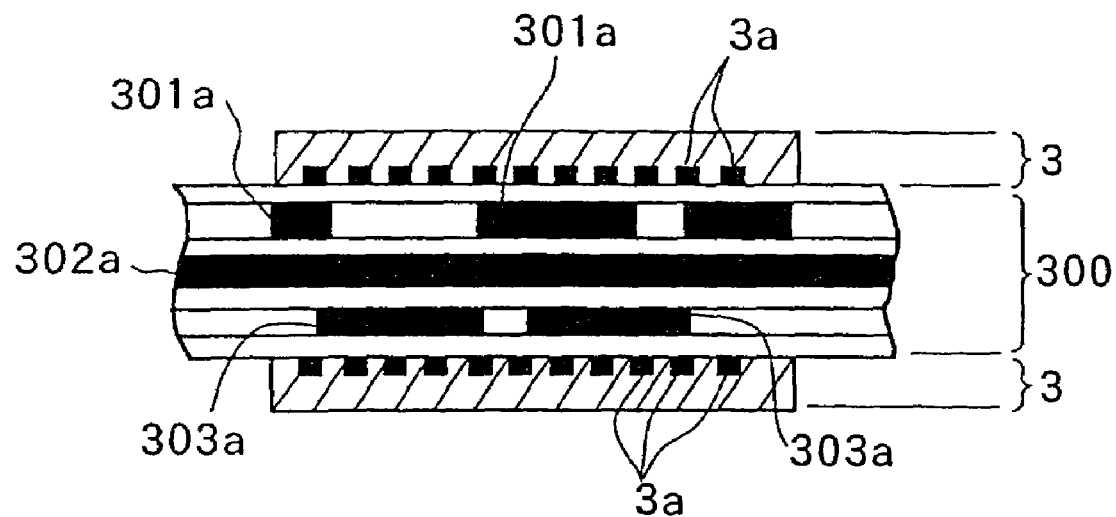
FIG. 13 is a sectional view taken along the line Z—Z of FIG. 12.

FIG. 12 is a schematic diagram of an inspection apparatus C for inspecting the multilayer circuit board 300. FIG. 13 is a sectional view taken along the line Z—Z of FIG. 12.

The inspection apparatus C includes the sensor unit 3 and the signal-processing unit 4 in addition to the construction of the above inspection apparatus B. It is understood that the computer 5 is adapted to operate with the pair of sensor units 3 and the signal-processing unit 4.

As shown in FIG. 13, the signal source 2 is connected directly to the overall electrode 302*a* of the multilayer circuit board 300, and an inspection signal is supplied to the overall electrode 302*a*. Further, the pair of sensor units 3 are disposed on the top and bottom surfaces of the multilayer circuit board 300, respectively.

In an inspection operation according to the inspection apparatus C having the above construction, each of the pair of sensor units 3 is disposed on the corresponding surface of the multilayer circuit board 300 with opposing to the overall electrode 302*a*. In this case, the sensor units 3 are disposed to interpose each of the circuit wirings 301*a* and 303*a* to be inspected between the overall electrode 202*a* and the corresponding sensor unit 3, as shown in FIG. 13.

Then, an inspection signal is supplied from the signal source 2 to the overall electrode 302*a*. As in the inspection apparatus A, a control signal is transmitted from the computer 5 to each of the sensor units 3 so as to sequentially switch the cell 3*a* to be connected to the terminals 3*e* of the sensor units 3. Further, each output signal appearing at the cells 3*a* is acquired by the computer 5 through the signal-processing unit 4 sequentially. In this case, this processing may be performed to one of the sensor units 3 and subsequently to the other sensor unit 3. Alternatively, this processing may be performed to both of the sensor units 3 simultaneously.

In this way, the multilayer circuit board having the pair of circuit wirings with interposing the overall electrode therebetween is advantageously inspected by the inspection apparatus C without any relocation of the sensor unit 3.

<Another Example of Sensor Unit 3>

In the above inspection apparatus A, the sensor unit 3 is adapted to detect only the signal according to the inspection signal. However, the construction of the sensor unit 3 may be partially modified to achieve a function as a sensor for detecting a signal according to an inspection signals (hereafter referred to as "Sensor Mode") and a function of the conductive member 1 (hereafter referred to as "Inspection Signal Transmit Mode").

Figure 14:
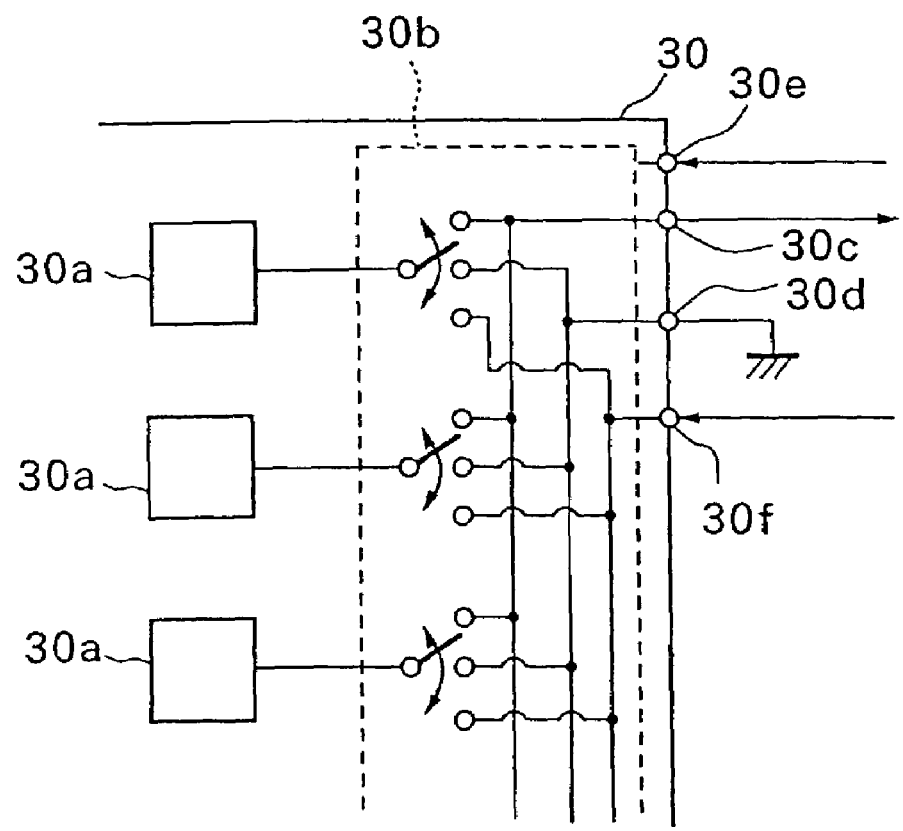
FIG. 14 is an internal block diagram of an inspection unit 30.
Figure 15:
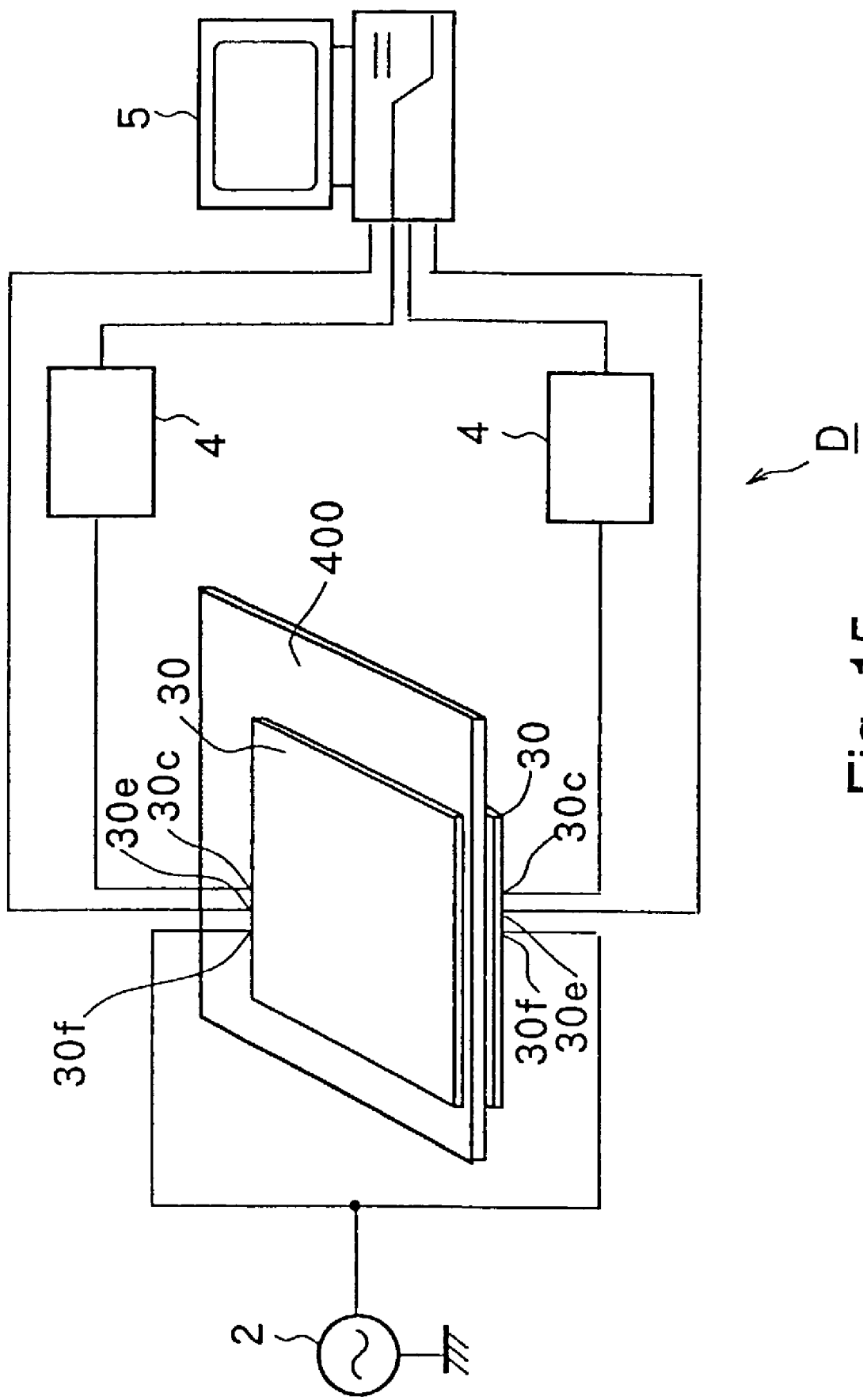
FIG. 15 is a schematic diagram of an inspection apparatus D employing the inspection unit 30.

FIG. 14 is an internal block diagram of an inspection unit 30 provided by improving the sensor unit 3. FIG. 15 is a schematic diagram of an inspection apparatus D using the inspection unit 30. The inspection unit 30 includes a plurality of cells 30*a*, a switching circuit 30*b*, and terminals 30*c* to 30*f*.

The cells 30*a* are equivalent to the cells 3*a* of the sensor unit 3, and are made of a conductive material in this embodiment. Each size of the cells 30*a*, the arrangement and number of the cells 30*a* and others are the same as those of the cells 3*a*.

The terminal 30*c* is equivalent to the terminal 3*c* of the sensor unit 3, and provided to output each output signal appearing at the cells 30*a* to the signal-processing unit 4 when the inspection unit 30 is used in the Sensor Mode. The terminal 30*d* is equivalent to the terminal 3*d* of the sensor unit 3, and is provided to connect each of the cells 3*a* to GND. The terminal 30*e* is equivalent to the terminal 3*e* of the sensor unit 3, and is provided to input a control signal from the computer 5 to the switching circuit 30*b*. The terminal 30*f* is connected to the signal source 2 so as to supply an inspection signal to each of cells 30*a*.

The switching circuit 30*b* is equivalent to the switching circuit 3*b* of the sensor unit 3, and is provided to switchingly connect each of cells 30*a* to either one of the terminal 30*c*, terminal 30*d* and terminal 30*f*. For example, the switching circuit 30*b* may be composed of a multiplexer, demultiplexer and others. When the inspection unit 30 is used in the Sensor Mode, the switching circuit 30*b* switchingly connects either one of the cells 30*a* to the terminal 30*c* and switchingly connects another cell 30*a* to the terminal 30*d* sequentially. Further, when the inspection unit 30 is used in the Inspection Signal Transmit Mode, all or a set of cells 30*a* are connected to the terminal 30*f*.

While the number of the cells 30*a* to be connected to the terminal 30*c* is limited to one in this embodiment because of the single terminal 30*c* as in the sensor unit 3, the terminal 30*c* may be provided for each of the cells 30*a* to acquire output signals from two or more of the cells 30*a* simultaneously in the Sensor Mode.

When receiving an output signal from either one of the cells 3a, it is desired to provide an enhanced S/N ratio of the output signal. This is the reason why each of the cells 3a is adapted to be connected to GND through the terminal 3d. However, when a sufficient S/N ratio can be obtained without connecting to GND, the cells 3a other than the cell 3a connected to the terminal 3c may be simply switchingly opened.

With reference to FIG. 15, the construction of an inspection apparatus D employing the inspection unit 30 will be described. The inspection apparatus D comprises a pair of inspection units 30. One of the inspection units 30 is disposed on the side of one of the surfaces of a circuit board 400 as a subject of inspection, and the other inspection unit 30 is disposed on the side of the other surface of the circuit board 400. In this step, each of the inspection units 30 is disposed with opposing their surfaces having the cells 30a to the circuit board 400 and to each other. As a result, the cells 30a of the pair of inspection units 30 may be disposed on the side of the opposite surfaces of the circuit board 400, respectively.

In the inspection apparatus D, each of the signal source 2, the pair of signal-processing units 4 and the computer 5 has the same construction as that described above, and the signal source 2 is connected to the terminal 30f of each of the inspection units 30. Further, each of the signal-processing units 4 is connected to each of the terminals 30c of the inspection units 30. Furthermore, the computer 5 is connected to each of the terminals 30e of the inspection units 30 to transmit a control signal to each of the inspection units 30.

While the pair of identical inspection units 30 have been used in the inspection apparatus D, it is not essential to be identical, and any other suitable construction having substantially the same function as described above may be used. Further, while the pair of signal-processing units 4 are provided corresponding to the inspection units 30 in the inspection apparatus D, a single signal-processing unit 4 may be provided and commonly used for the inspection units 30.

In an inspection operation according to the inspection apparatus D having the above construction, one of the inspection units 30 is disposed on the side of one of the surfaces of the circuit board 400, and then the other inspection unit 30 is disposed on the side of the other surface of the circuit board 400 with opposing to the one of the inspection units 30 disposed precedently to arranged in the state as shown in FIG. 15.

Then, the computer 5 transmits a control signal to each of the inspection units 30 to switch one of the inspection units 30 to the Inspection Signal Transmit Mode and to switch the other inspection unit 30 to the Sensor Mode.

More specifically, all or a set of the cells 30a of one of the inspection unit 30 are switchingly connected to the terminal 30f by the switching circuit 30b so as to bring this inspection unit 30 into the Inspection Signal Sending mode. Thus, each of the cells 30a of this inspection unit 30 is supplied with an inspection signal from the signal source 2 and thereby functions as the above conductive member 1.

Furthermore, each of cells 30a of the other inspection unit 30 is switchingly connected to the terminal 30c sequentially by the switching circuit 30b to bring this inspection unit 30 into the Sensor Mode, and thereby the computer 5 can acquire each output signal appearing at the cells 30a of this inspection unit 30 through the signal-processing unit 4. Thus, this inspection unit 30 functions as the above sensor unit 3.

Then, the acquired output signals will be evaluated by the computer 5 according to the above step so as to obtain an inspection result of the circuit board 400. As above, in the inspection apparatus D, the inspection unit 30 can function as any one of the sensor unit 3 or the conductive member 1.

Thus, the inspection apparatus D is advantageous when a circuit board such as the above multilayer circuit board 300 is inspected.

That is, an inspection is first performed with bringing one of the inspection units 30 into the Inspection Signal Transmit Mode and the other inspection unit into the Sensor Mode, and is then performed with reversed modes, or with bringing the one inspection unit into the Sensor Mode and the other inspection unit into the Inspection Signal Transmit Mode. This allows both of the circuit wirings 301a and 303a to be inspected without any relocation of the inspection units 30.

In this case, the circuit wiring of the circuit wiring layer interposed between the inspection unit 30 in the Sensor Mode and the overall electrode layer 302 is inspected. Because, when an inspection signal is supplied to the inspection unit 30 in the Inspection Signal Transmit mode, a signal in response to the inspection signal is generated over the overall electrode 302a uniformly (in principal, this is the same as that causing each output signal appearing at the cells), and thereby the overall electrode 302a functions as the conductive member 1.

As above, while the preferred embodiments of the present invention have been described, it is to be understood that various other embodiments can be made without departing from the spirit of the present invention. Further, it is also to be understood that each constructions of the above inspection apparatuses A–D can be used or applied to each other without departing from the sprit of the present invention.

INDUSTRIAL APPLICABILITY

As described above, when supplying an inspection signal to a circuit wiring, the present invention makes it possible to eliminate any need for a pin to be brought into contact with the circuit wiring and to detect any defects including an invisible microscopic defect.

What is claimed is:

1. An inspection apparatus for inspecting a circuit wiring of a circuit board, said inspection apparatus comprising: a conductive member disposed on one of the surfaces of said circuit board and to be supplied with an inspection signal; means for supplying the inspection signal to said conductive member; a plurality of cells disposed on the other surface of said circuit board; means for acquiring each signal appearing at said cells in response to said inspection signal applied to said conductive member; and means for analyzing the circuit wiring by measuring the capacitance between the conductive member and the plurality of cells.

2. An inspection apparatus as defined in claim 1, wherein said conductive member includes a surface formed in conformity with said one surface of said circuit board, and said cells are two-dimensionally arranged in conformity with said other surface of said circuit board.

3. An inspection apparatus as defined in claim 2, wherein said conductive member has a flat plate shape.

4. An inspection apparatus as defined in claim 2, wherein said cells are arranged in a matrix form.

5. An inspection apparatus as defined in claim 1, wherein said conductive member is composed of a plurality of conductive pieces.

6. An inspection apparatus as defined in claim 1, which further includes:

means for generating image data representing the position and shape of said circuit wiring, according to the signals appearing at said cells; and means for displaying the image.

7. An inspection apparatus as defined in claim 1, which further includes storing means having thereon stored wiring data representing the position and shape of said circuit wiring.

8. An inspection apparatus as defined in claim 1, which further includes:

storing means having thereon stored wiring data representing the position and shape of the circuit wiring;

means for detecting a disconnection, short-circuit or chipping in said circuit wiring, or a dust on said circuit board according to the signals appearing at said cells and said wiring data.

9. An inspection method for inspecting a circuit wiring of a circuit board, said inspection method comprising the steps of: disposing a conductive member on one of the surfaces of said circuit board, said conductive member being supplied with an inspection signal; disposing a plurality of cells on the other surface of said circuit board; supplying the inspection signal to said conductive member; acquiring each signal appearing at said cells in response to said inspection signal applied to said conductive member; and measuring the capacitance of the acquired signals to determine a condition of the circuit wiring.

* * * * *